United States Patent [19]

Glover

[11] Patent Number: 4,593,247

[45] Date of Patent: Jun. 3, 1986

[54] METHOD OF NMR IMAGING WITH OFF-CENTER ZOOM SCAN

[75] Inventor: Gary H. Glover, Waukesha, Wis.

[73] Assignee: General Electric Company, Milwaukee, Wis.

[21] Appl. No.: 555,097

[22] Filed: Nov. 25, 1983

[51] Int. Cl.$^4$ .............................................. G01R 33/22
[52] U.S. Cl. ..................................... 324/309; 324/307
[58] Field of Search ............. 324/309, 307, 312, 77 E, 324/77 B

[56] References Cited

U.S. PATENT DOCUMENTS

| | | | |
|---|---|---|---|
| 4,297,637 | 10/1981 | Crooks | 324/309 |
| 4,443,760 | 4/1984 | Edelstein | 324/309 |
| 4,484,138 | 11/1984 | Bottomley | 324/307 |
| 4,506,223 | 3/1985 | Bottomley | 324/307 |

OTHER PUBLICATIONS

Proceedings of an International Symposium on NMR Imaging–(Oct. 1-3, 1981) "NMR Scanning: The Spin Warp Method", James Hutchison, pp. 77–80.
Proceedings of an International Symposium on NMR Imaging–(Oct. 1-3, 1981) "NMR Imaging at 5.1 MHz: Work in Progress", Edelstein, pp. 139–145.

Primary Examiner—Reinhard J. Eisenzopf
Assistant Examiner—G. Peterkin
Attorney, Agent, or Firm—Alexander M. Gerasimow; Douglas E. Stoner

[57] ABSTRACT

In Fourier transform NMR imaging, magnified images free of aliasing artifacts are achieved by band limiting the NMR signal in the X- and Y-axes directions thereby avoiding under-sampling. Band limiting in the X-axis direction is accomplished by reducing the signal bandwith by a low-pass filter before A/D conversion. In the Y-axis direction, the signal is band limited by providing selective excitation of the spin isochromats, such that only spins in a selected Y region of the object are available to contribute to the signal. When the region of interest is not centered, offsets in the X- and Y-axes directions are obtained by shifting the receiver frequency by an amount $\Delta f_R$, and causing the selective RF pulse to have a complex amplitude.

13 Claims, 7 Drawing Figures

METHOD OF NMR IMAGING WITH OFF-CENTER ZOOM SCAN

BACKGROUND OF THE INVENTION

This invention relates to imaging methods utilizing nuclear magnetic resonance (NMR) technique. In particular, this invention relates to a method of collecting data to reconstruct an artifact-free portion of a larger image. Additionally, in accordance with the invention, the region of interest need not necessarily coincide with the center of the scanner.

By way of background, the nuclear magnetic resonance phenomenon occurs in atomic nuclei having an odd number of protons and/or neutrons. Due to the spin of the protons and the neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio which is constant for each NMR isotope and wherein B is the magnetic field (including $B_o$) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at the Larmor frequency. Typically, such magnetic fields designated $B_1$ are applied orthogonal to the direction of the static magnetic field by means of a radio frequency (RF) pulses through coils connected to a radio-frequency-transmitting apparatus. The effect of field $B_1$ is to rotate magnetization M about the direction of the $B_1$ field. This may be test visualized if the motion of magnetization M due to the application of RF pulses is considered in a Cartesian coordinate system (rotating frame) which rotates at a frequency substantially equal to the resonant frequency $\omega$ about the main magnetic field $B_o$ in the same direction in which the magnetization M precesses. In this case, the $B_o$ field is chosen to be directed in the positive direction of the Z-axis, which, in the rotating frame, is designated Z' to distinguish it from the fixed-coordinate system. Similarly, the X- and Y-axes are designated X' and Y'. Bearing this in mind, the effect of an RF pulse, then, is to rotate magnetization M, for example, from its direction along the positive Z' axis toward the transverse plane defined by the X' and Y' axes. An RF pulse having either sufficient magnitude or duration to rotate magnetization M into the transverse plane (i.e., 90° from the direction of the $B_o$ field) is conveniently referred to as a 90° RF pulse. Similarly, if either the magnitude or (for a rectangular pulse) the duration of an RF pulse is selected to be twice that of a 90° pulse, magnetization M will change direction from the positive Z' axis to the negative Z' axis. This kind of an RF pulse is referred to as a 180° RF pulse, or for obvious reasons, as an inverting pulse. It should be noted that a 90° or a 180° RF pulse (applied perpendicular to M) will rotate magnetization M through the corresponding number of degrees from any initial direction of magnetization M. It should be further noted that an NMR signal will only be observed if magnetization M has a net transverse component (perpendicular to $B_o$) in the X'-Y' (transverse) plane. A 90° RF pulse produces maximum net transverse magnetization in the transverse plane since all of magnetization M is in that plane, while a 180° RF pulse does not produce any transverse magnetization.

RF pulses may be selective or nonselective. Selective pulses are typically modulated to have a predetermined frequency content so as to excite nuclear spins situated in preselected regions of the sample having precession frequencies as predicted by the Larmor equation. The selective pulses are applied in the presence of localizing magnetic-field gradients. Nonselective pulses generally affect all of the nuclear spins situated within the field of the RF pulse transmitter coil and are typically applied in the absence of localizing magnetic-field gradients.

There remains to be considered the use of magnetic-field gradients to encode spatial information (used to reconstruct images, for example) into NMR signals. Typically, three such gradients are necessary:

$$G_x(t) = \partial B_o / \partial x,$$

$$G_y(t) = \partial B_o / \partial y,$$

and $$G_z(t) = \partial B_o / \partial z.$$

The $G_x$, $G_y$, and $G_z$ gradients are constant throughout the imaging slice, but their magnitudes are typically time dependent. The magnetic fields associated with the gradients are denoted, respectively, $b_x$, $b_y$, and $b_z$, wherein $$b_x = G_x(t)x,$$

$$b_y = G_y(t)y,$$

$$b_z = G_z(t)z,$$

within the volume.

In NMR imaging, it is frequently desirable to reconstruct a portion of a larger image. It may also be desirable to magnify that portion of the image which is of interest. Additionally, often the region of interest does not necessarily coincide with the center of the scanner. An example of this might be cervical or thoracic spine studies.

The transverse (e.g., in the direction of the X-axis) field of view of an NMR image is determined by the gradient amplitudes, and the rate of which the NMR signal is sampled (A/D sampling rate). For definiteness, it is beneficial to consider the case of Fourier transformation imaging schemes (such as the two-dimensional spin-warp technique to be described hereinafter, although the disclosure is generalized hereinafter to the three-dimensional case) with the X direction being the direction in which a readout magnetic-field gradient $G_x$ is applied, and the Y direction being that of a phase-encoding gradient $G_y$. The field of view in a direction orthogonal to that of the transverse view is determined by the number of discrete phase-encoding $G_y$ gradients and their amplitudes. Increasing the amplitudes of the $G_x$ and $G_y$ gradients spreads out the object over a larger frequency and phase bandwidth. This has the result of magnifying the object in the reconstruction. However, unless the sampling rate (in the X- and Y-axis directions) is increased concomitantly, the reconstruction will exhibit aliasing, or fold-over of those portions of the object outside the field of view (i.e., those frequencies and phases which are under-sampled).

One approach which resolves the aliasing problem is to sample more rapidly in both the X direction (faster A/D rate) and in the Y direction (more phase-encoding "views"). In this case, however, for a 2× magnification four times the data must be acquired if the object just fills the original field of view. This is often not a satisfactory solution, since, in NMR, it is generally desired to keep data collection time as short as possible.

A means of resolving part of the under-sampling problem is to reduce the bandwidth of the NMR signal by a low-pass filter before the A/D conversion. Then, the portions of the object outside the field of view in the X direction will not alias into the reconstruction. An analogous band-limiting operation for the Y direction is not so obvious, however.

Briefly, in accordance with the invention, band limiting in the Y-axis direction is achieved by applying a selective 180° RF pulse in the presence of a $G_y$ gradient. The resulting spin echo then contains phase information from only a variable-width region in the selected slice. The width of the region is dependent on the gradient and the frequency content of the selective 180° pulse.

A technique using a gradient and a selective 180° pulse has been previously used to collect imaging data from a line of inverted spins. The intent in line imaging is to limit data collection in the selection direction (e.g., the Y-axis direction) to a single pixel. That is, if an image has a resolution of 128 pixels in the Y-axis direction, then a signal must be obtained from 128 different lines. A linear read-out gradient in the direction of the line (i.e., the X axis) is applied to differentiate the spin frequency dependence on the position of the spin along the line. An example of such a technique is disclosed in U.S. Pat. No. 4,297,637, issued to Crooks et al.

A significant difference between the line imaging method and the inventive method for band limiting the phase of the NMR signal in the Y-axis direction is that, in accordance with the invention, pixel information in the Y-axis direction is created by Fourier transformation of the NMR signal with respect to the phase-encoding gradient amplitude or the amplitude X gradient duration product. Additionally, all of the 128 (assuming the image has 128 pixels in the Y-axis direction) NMR signals are used to obtain an improvement in the signal-to-noise (S/N) ratio of $1/\sqrt{128}$. In the event a 256 pixel image is reconstructed the S/N improvement would be $1/\sqrt{256}$. In general, if the image has N pixels in the Y-axis direction, then the signal-to-noise ratio improvement is $1/\sqrt{N}$. This is an advantage not realized with the line imaging methods.

It is therefore an object of the present invention to provide a method to band limit the data in the Y direction so that additional phase-encoding views are not required.

It is a further object of the invention to provide means whereby the magnified field of view can be centered at a location different than the isocenter of the gradient system.

SUMMARY OF THE INVENTION

An inventive NMR imaging method is provided for producing images free of aliasing artifacts. In accordance with the method, an object to be imaged is positioned in a homogeneous magnetic field directed along an object axis. Nuclear spins in a predetermined region of the object are excited to resonance following which a phase-encoding magnetic-field gradient directed along another object axis is applied. The phase-encoding gradient has different amplitudes in successive applications. The object is then irradiated with a selective, inverting RF pulse in the presence of a first gradient to initiate the refocussing of nuclear spins in a portion of the predetermined region. The nuclear spins refocus in the presence of a second gradient to produce a spin-echo signal which is phase limited in the direction of the first gradient. The spin echo is also band limited in frequency, prior to sampling, in the direction of the second gradient. Sampling is accomplished at a rate sufficient to recover the maximum frequency in the filtered signal. Fourier analysis of the phase- and frequency-limited signal yields pixel image data for reconstructing an artifact-free image of the object portion.

DETAILED DESCRIPTION OF THE INVENTION

The invention is disclosed initially with reference to a two-dimensional embodiment. A three-dimensional embodiment is disclosed hereinafter.

Figure 1A:
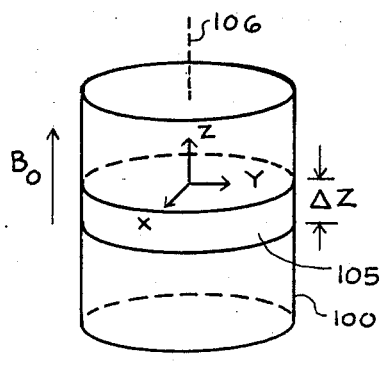
FIG. 1a illustrates an NMR sample positioned in a static magnetic field and having a planar volume defined therein by selective excitation.

FIG. 1a depicts an NMR sample 100 situated in a static homogeneous magnetic field $b_o$ directed in the positive Z-axis direction of the Cartesian coordinate system. The Z axis is selected to be coincident with the long or cylindrical axis 106 of sample 100. The origin of the coordinate system is taken to be the center of the sample, which is also at the center of a planar slice 105 selected by the principle of selective excitation in the presence of magnetic-field gradients, as will be described hereinafter with reference to FIG. 2. Since the $B_o$ field is applied continuously during NMR imaging, it is not shown in any of the figures depicting pulse sequences.

Figure 2:
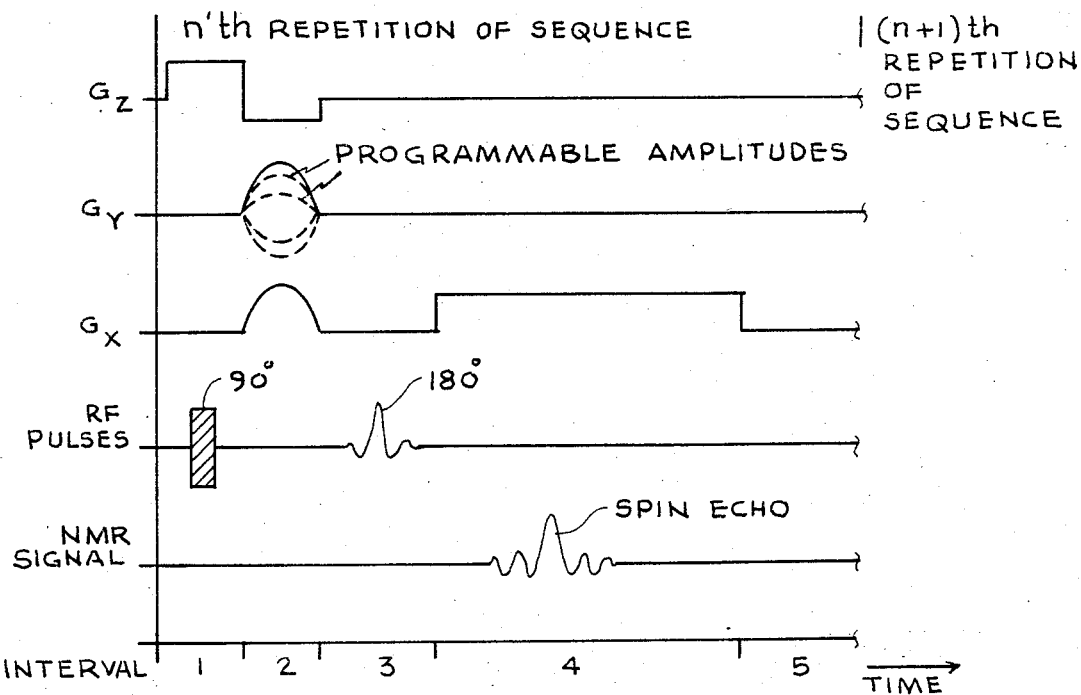
FIG. 2 depicts a conventional NMR pulse sequence of the type commonly referred to as the spin-warp sequence which is a special case of the Fourier transform imaging scheme.

Referring now to FIG. 2 which depicts a conventional, two-dimensional, spin-warp imaging sequence, it will be seen that in interval 1 indicated along the horizontal axis a positive $G_z$ gradient pulse is applied. The direction of the $G_z$ gradient is arbitrarily selected to be in the positive Z-axis direction of the Cartesian coordinate system and coincides with the direction of the $B_o$ magnetic field. Also, in interval 1, a selective 90° RF pulse is applied in the presence of the $G_z$ gradient so as to excite nuclear spins in planar volume 105 shown in FIG. 1a. The thickness $\Delta Z$ of slice 105 and its position along axis 106 of sample 100 are determined by the amplitude of the $G_z$ gradient and the frequency content of the selective 90° RF pulse. In the preferred embodiments of the invention, the RF pulse is modulated by a sinc function (sin x/x) so as to preferentially excite nuclear spins in an imaging slice having a substantially rectangular profile. The 90° RF pulse and other selective RF pulses can also be modulated with a Gaussian function in which case the profile of slice 105 will be Gaussian.

When the $G_z$ gradient is turned off, the excited nuclear spins precess at the same frequency but are out of phase with one another, due to the de-phasing effect of the gradient. Phase coherence of the excited nuclear spins is re-established by the application in interval 2 of a negative $G_z$ gradient pulse. Typically, the time integral of the waveform of the $G_z$ gradient over interval 2 required to re-phase the spins is selected to be approximately equal to the negative one half of the time integral of the $G_z$ gradient waveform in interval 1. Also, during interval 2, a phase-encoding $G_y$ gradient is applied simultaneously with the application of a positive $G_x$ gradient pulse. The $G_y$ gradient has a single, peak amplitude during the nth repetition of the sequence comprising intervals 1 through 5. However, in each successive application, such as the (n+1)th repetition of the sequence, a different amplitude of the phase-encoding gradient is selected. The $G_y$ gradient encodes spatial information in the Y-axis direction by introducing a twist in the orientation of the transverse magnetization by a multiple of $2\pi$. Following the application of a first phase-encoding gradient, the transverse magnetization is twisted into a one-turn helix. Each different amplitude of the $G_y$ gradient introduces a different degree of twist (phase encoding). The number of programmable $G_y$ gradient amplitudes is chosen to be equal to the number of pixels (typically 128 or 256) the reconstructed image will have in the Y-axis direction. It will be recognized that, although the invention is disclosed and claimed with reference to programmable $G_y$ gradient amplitudes, phase-encoding can also be achieved using phase-encoding gradients having programmable amplitude-duration products.

The effect of the $G_x$ gradient in interval 2 is to dephase the nuclear spins by a predetermined amount such that, when a non-selective 180° RF pulse (in the conventional spin-warp sequence) is applied in interval 3, a spin-echo signal will be produced in interval 5. The time of occurrence of the spin-echo signal is determined by the intensity of the $G_x$ gradient applied in interval 2, the time the 180° pulse is applied, as well as the intensity of the linear $G_x$ gradient applied in interval 4. Spatial information is encoded in the X-axis direction by the $G_x$ gradient causing the nuclear spins to resonate at frequencies characteristic of their locations with respect to the X axis. The spin-echo signal is sampled in interval 4 a number of times which is typically equal to the number of pixels (typically 128 or 256) the reconstructed image will have in the X-axis direction. In a typical imaging sequence, the number of spin-echo signals observed is generally equal to the number of programmable amplitudes of the $G_y$ gradient. The image pixel values are obtained from the sampled signals in a well-known manner using a two-dimensional Fourier transform (in the case of two-dimensional Fourier transform scheme).

In the conventional spin-warp imaging technique described above, the spin-echo signal observed in interval 4 of FIG. 2 is due primarily to nuclear spins situated throughout planar slice 105. To produce a magnified image of a portion of imaging slice 105, it is necessary to increase the amplitudes of the $G_x$ and $G_y$ gradients. This has the effect of spreading out the object over a larger frequency bandwidth and, thus, magnifying it in the reconstruction. It will be recognized from the sampling theorem, however, that unless the sampling rate is also increased, the reconstructed image will exhibit aliasing, or fold-over of those portions of the object outside the field of view. The fold-over is attributable to the under sampling of the NMR signal (having higher frequencies) arising from those portions of the object which are outside the field of view. The under-sampled frequencies associated with the object portion outside the field of view erroneously appear as low frequencies which, due to the frequency/position relationship created by the gradient, the object portions appear in the reconstructed image as being shifted, folded-over replicas.

In accordance with the invention, the under-sampling problem is resolved in the X direction by reducing the bandwidth of the NMR signal by means of a low-pass filter (not shown) before the A/D conversion (sampling) operation so as to remove those frequency components which lie outside the field of view. In this manner, the portions of the object outside the field of view in the X-axis direction will not alias into the reconstruction.

Figure 1B:
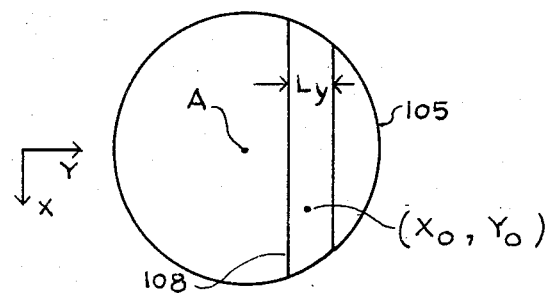
FIG. 1b, 1c, and 1d are top views of the planar volume selected in FIG. 1a, with respect to which the invention is disclosed.

The solution to the band-limiting problem in the Y-axis direction is to provide selective excitation of the spin isochromat in the direction of that axis. By this means, only spins in a selected Y region of the object are available to contribute to the signal. In a conventional, non-zoom (unmagnified) pulse sequence, such as that illustrated in FIG. 2, a non-selective 180° RF pulse is applied in interval 3. This causes the transverse magnetization from throughout planar slice 105 to rephase and form a spin echo in interval 4. In accordance with the invention, however, the 180° RF pulse comprises a selective pulse applied in conjunction with a positive $G_y$ gradient as seen in interval 3 of FIG. 3. The frequency bandwidth, $f_B$, of the 180° RF pulse and the gradient amplitude $G_y$ are chosen to select only a limited field of view having a width $L_y$ as illustrated in FIG. 1b, in accordance with the equation $$2\pi\gamma G_y L_y = f_B, \qquad (1)$$

where $\gamma$ is the gyromagnetic ratio. In this case, then, the spin-echo signal is due to the rephasing nuclear spins situated in a selected region 108 of planar slice 105 having a width $L_y$. The spin-echo signal is band limited in phase, since it arises only from nuclear spins situated in region 108, rather than from entire slice 105.

Figure 3:
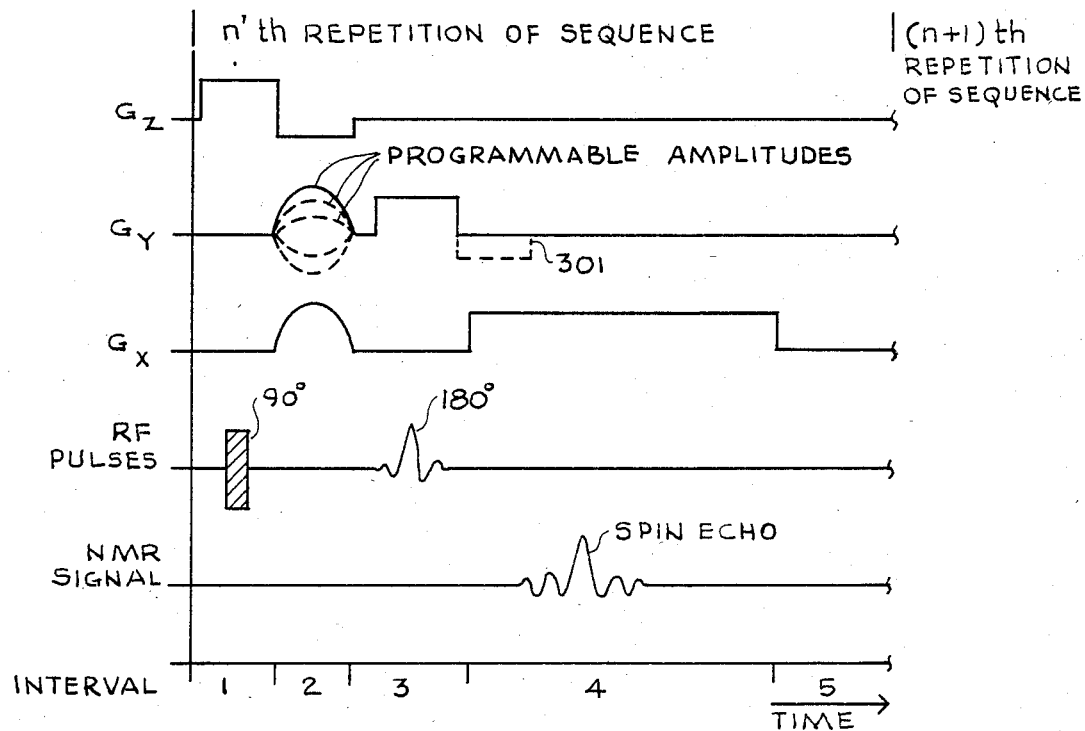
FIG. 3 is an illustration of the two-dimensional spin-warp pulse sequence including one embodiment of the present invention.

In the course of a complete scan to obtain sufficient data to reconstruct, for example, a 128×128 pixel image, the pulse sequence of FIG. 3 is repeated 128 times. In each repetition (assuming no averaging), the amplitude of the $G_y$ gradient in interval 2 is incremented. In this manner, there will be 128 different phases encoded across the field of view $L_y$ in the Y-axis direction. For each repetition, the $G_y$ gradient and the selective 180° pulse in interval 3 remain unchanged.

Figure 1C:
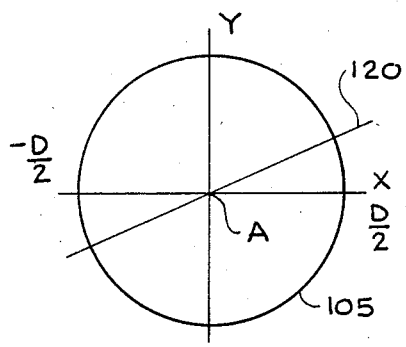

By way of further explanation, consider FIG. 1c which depicts slice 105 having a transverse diameter D, and a $G_x$ gradient superimposed thereon as suggested by line 120 passing through the center of the slice. Each point along the X-axis has associated therewith a frequency (recalling that $\omega = \gamma B$) such that an NMR signal emanating from slice 105 would have a frequency bandwidth determined by the gradient amplitudes at points D/2 and −D/2. To faithfully reproduce the object lying within slice 105, the sampling rate must be at least twice the maximum frequency in the NMR signal. In this case, the sampling frequency $f_S$ is equal to $2\pi\gamma G_x D$.

Figure 1D:
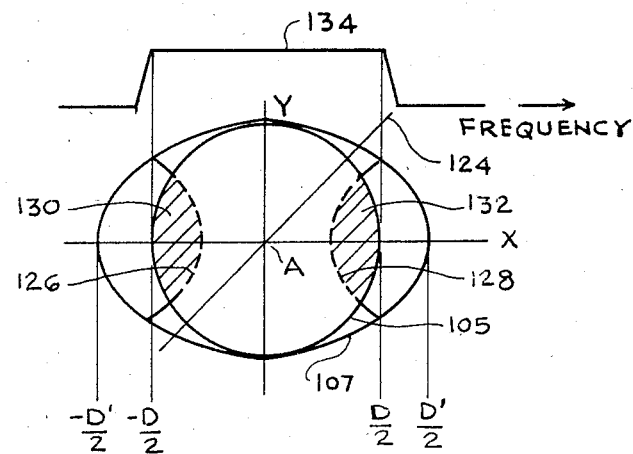

Referring now to FIG. 1d, there is shown a region of interest 105 having a diameter D within an object 107 having a diameter D'. A $G_x$ gradient having a greater amplitude, as suggested by line 124 having a greater slope (gauss/an) than line 120 (FIG. 1c), is applied. An increased amplitude $G_x$ gradient would be applied to reconstruct a magnified image. Due to the increased magnetic field, points D'/2 and −D'/2 (FIG. 1d) correspond to higher frequencies such that $f_s$ is now less than $2\pi\gamma G_x D'$. Unless either the sampling frequency is increased or the signal bandwidth is narrowed, object portions lying outside D/2 and −D/2 will alias (fold over) as indicated by dashed lines 126 and 128. The aliased portions appear superimposed in the reconstructed image as suggested by shaded regions 130 and 132. In practice, the band-limiting approach is used to limit the signal frequency in the X-axis direction. The NMR signal emanating from region 107 (FIG. 1d) is filtered, prior to sampling, using a filter having a bandpass characteristic allowing only frequencies between D/2 and −D/2 to pass. This is graphically depicted in FIG. 1d by a filter pass-band function designated by reference numeral 134. In this manner, frequencies between D/2 and D'/2, and −D/2 and −D'/2, which would be under sampled are eliminated. Point A in FIGS. 1a, 1c, and 1d is termed the isocenter and has an image center frequency associated with it. The isocenter is reference point defined by the planes containing the $G_x$, $G_y$, and $G_z$ magnetic-field gradients.

Band limiting in the Y-axis direction to avoid artifacts due to aliasing is achieved by the selective inversion of spins in a region 108 of slice 105 depicted in FIG. 1b. This is accomplished in a manner described hereinbefore with reference to FIG. 1b and the pulse sequence of FIG. 3.

In the preferred embodiment of the invention, the selective 180° RF pulse is amplitude modulated by a sin x/x function. The pulse bandwidth is 2/T, where T is the temporal interval between the first two zeroes of the sin x/x function as illustrated in FIG. 3. Then, $$G_y T = \frac{1}{\pi \gamma L_y}. \quad (2)$$

It will be recognized from Equation (2) that the field of view $L_y$ is a function of the amplitude of the $G_y$ gradient (interval 3, FIG. 3) and the bandwidth of the selective 180° RF pulse. Thus, the amplitude of $G_y$ must be larger if $L_y$ is narrower. Concomitantly, the bandwidth $f_B$ becomes larger with increased gradient amplitude.

It should be noted that a rephasing pulse 301 shown in FIG. 3 by dashed lines, similar to the $G_z$ rephasing pulse applied in interval 2, may be employed with the pulse sequence of the invention to rephase the nuclear spins inverted by the application of the selective 180° RF pulse in interval 3 of FIG. 3. It should be additionally noted that the rephasing gradient lobe 301 can be combined and applied simultaneously with the $G_y$ phase-encoding pulses applied in interval 2 of FIG. 3.

In some cases, the region of interest to be magnified may not be centered at point A, FIG. 1b, of the original field of view. In this case, for an offset of $X_o$ in the X-axis direction, the NMR receiver frequency is shifted from the image center frequency associated with point A by an amount $\Delta f_R$ given by $$\Delta f_R = 2\pi \gamma G_x X_o, \quad (3)$$

where $G_x$ is the amplitude of the readout gradient (interval 4, FIG. 3), and $X_o$ is the desired offset (FIG. 1b).

For an offset $Y_o$ in the Y-axis direction, the 180° selective RF pulse is caused to have a complex amplitude of the form $$RF = \frac{\sin(\pi f_B t)}{\pi f_B t} e^{i\omega_1 t}, \quad (4)$$

where $$\omega_1 = 2\pi f_B \frac{Y_o}{L_y}, \quad (5)$$

in which $\omega_1$ is the center frequency associated with point A, FIG. 1c. The position of region 108 along the y-axis is determined by frequency $\omega_1$. If $\omega_1$ is selected to equal zero, then region 101 is centered about point A. The complex data must be phase corrected before applying a Fourier transforms for image reconstruction. Data sampled in time t is multiplied by $e^{i\omega_2 t}$ to achieve the correction. Frequency $\omega_2$ is given by $$\omega_2 = 2\pi f_B \frac{X_o}{L_x}, \quad (6)$$

where $L_x$ is the width of the reconstruction region in the X-axis (readout) direction.

Figure 4:
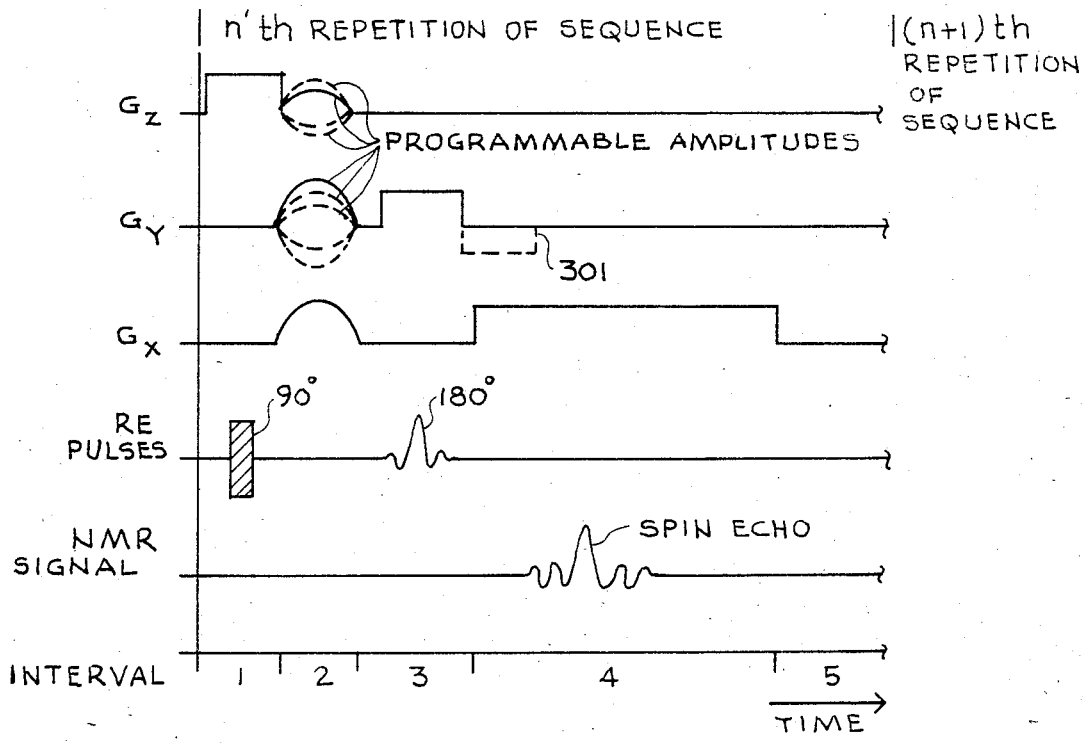
FIG. 4 depicts a three-dimensional spin-warp pulse sequence in accordance with the invention.

The two-dimensional embodiment of the invention has been described by way of example with reference to FIG. 3. It will be recognized, however, that the invention may also be practiced with the three-dimensional version of spin warp which is depicted in FIG. 4. This pulse sequence is substantially identical to that depicted in FIG. 3, but with the notable exception that the selective RF pulse applied in interval 1 of FIG. 4 is selected to have a frequency content so as to preferentially excite nuclear spins in a thicker region of the object undergoing examination. Additionally, the $G_z$ gradient is provided with multiple phase-encoding programmable amplitudes equal in number to the number of slices in which the excited region is to be divided. To this end, the frequency bandwidth of the RF excitation pulse in interval 1 is also determined by the number of slices desired. It should be noted that it is desirable both in FIGS. 3 and 4, but not necessary, to use a selective excitation pulse. For example, the volume may be defined by the geometry of the RF transmitter coil.

The $G_z$ magnetic-field gradient in interval 2 (FIG. 4) is comprised of two components. The first component is a negative rephasing pulse similar to that applied in interval 2 of FIG. 3 which is necessary to rephase the nuclear spins excited in interval 1. The second gradient component is a phase-encoding pulse which encodes spatial information into the NMR signal arising from the excited region in the Z-axis direction. The $G_z$ gradient is shown in interval 2 as a single pulse because the action of the two components is linearly independent and, therefore, can be added to form a single pulse which performs both the rephasing and phase-encoding actions simultaneously.

In using the pulse sequence of FIG. 4 to acquire data, a single amplitude of the $G_z$ phase-encoding gradient is selected and held while the $G_y$ phase-encoding gradient is advanced through a number of amplitudes equal to the number of pixels the reconstructed image is to have in the Y-axis direction. Thereafter, the next amplitude of the $G_z$ gradient is selected and the $G_y$ gradient is then again sequenced through its range of amplitudes. This process is repeated for each of the amplitudes of the $G_z$ gradient. Image pixel data is obtained by utilizing a three-dimensional Fourier transform.

As in the two-dimensional embodiment, phase limiting in the Y-axis direction is achieved by the application in interval 3 of a selective 180° RF pulse in the presence of a $G_y$ gradient pulse. Bandwidth reduction in the X-axis direction is accomplished by a band-pass filter.

The invention substantially as disclosed herein (with reference to the two-dimensional embodiment) has been tested on an NMR system utilizing a superconductive system to produce the main magnetic field having the strength of 0.3 Tesla. The reconstructed images were obtained utilizing a conventional resolution phantom (volumes of water enclosed in a non-NMR active material to form a line-pair pattern). In a first experiment not utilizing the principles of the invention, the transverse gradients, $G_x$ and $G_y$, were increased in magnitude by a factor of 2 to achieve a 2× zoom. A "fold-over" of the phantom, due to aliasing, was noted in both the X- and Y-axes directions. In contrast, the reconstructed magnified image using band limiting in the X and Y directions as disclosed herein, including the selective 180° RF pulse applied in the presence of the $G_y$ gradient as illustrated in FIG. 3 was essentially free of any aliasing artifacts.

From the foregoing, it will be appreciated that the invention provides a method for band limiting the NMR signal in the Y direction so that additional views, and hence increase the scan time, are not required. It will be also appreciated that the method in accordance with the invention provides a means whereby a magnified field of view can be centered at a location different from the isocenter of the gradient system.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

I claim:

1. A method of producing NMR images free of aliasing artifacts, comprising the steps of:
    (a) positioning an object to be imaged in a homogeneous magnetic field directed along a first axis of said object;
    (b) exciting to resonance a plurality of nuclear spins in a predetermined region of said object;
    (c) applying to said predetermined region at least one phase-encoding magnetic-field gradient, having one of a plurality of programmable amplitudes, which gradient is directed along at least one additional axis of said object;
    (d) irradiating said object with a selective, inverting RF pulse in the presence of a first magnetic-field gradient to initiate the refocussing of nuclear spins in a portion of said predetermined region;
    (e) allowing said nuclear spins in said portion to refocus in the presence of a second magnetic-field gradient to produce a spin-echo signal having a frequency dependence on position in the direction of said second gradient, said spin echo being phase limited in the direction of said first gradient;
    (f) filtering said spin-echo signal to band limit the frequency content thereof to frequencies corresponding to those associated with said second gradient co-extensive with said portion;
    (g) sampling said spin-echo signal at a sufficient rate to recover the maximum frequency in the filtered signal, prior to repeating said steps (b)–(f) for a different amplitude of said phase-encoding gradient; and
    (h) Fourier analyzing said sampled spin-echo signals to obtain pixel image data for reconstructing an image of said object portion which is free of aliasing artifacts.

2. The method of claim 1 wherein said step of exciting comprises:
    irradiating said object in the presence of a third magnetic-field gradient with a selective excitation RF pulse having a component perpendicular to said first axis.

3. The method of claim 2 wherein said selective excitation pulse comprises a 90° RF pulse.

4. The method of claim 2 wherein said phase-encoding gradient is orthogonal to said first axis.

5. The method of claim 4 wherein said first magnetic-field gradient is directed in the same direction as said phase-encoding gradient.

6. The method of claim 5 wherein said second magnetic-field gradient is orthogonal to said phase-encoding and to said third magnetic-field gradients, wherein the intersection of the planes containing said second, third, and phase-encoding gradients define an isocenter which is coincident with the image center having a center frequency associated therewith.

7. The method of claim 6 wherein said image center is offset by an amount $X_o$ along the direction of said second magnetic-field gradient from said isocenter, such that said spin-echo signal is received at a frequency offset from said center frequency by an amount $\Delta f_R$ given by $$\Delta f_R = 2\pi \gamma G_x X_o,$$

wherein $G_x$ is the magnitude of said second magnetic-field gradient.

8. The method of claim 6 wherein said inverting RF pulse comprises a selective 180° pulse.

9. The method of claim 8 wherein said 180° RF pulse is modulated by a sin x/x function, the bandwidth $f_B$ of said 180° pulse being 2/T, wherein T is the temporal interval between the first two zeroes of said sin x/x function.

10. The method of claim 8 wherein the field of view $L_y$ of said portion of said predetermined region is given by $$L_y = \frac{1}{\pi \gamma G_y T},$$

wherein
- $\gamma$ is the gyromagnetic ratio;
- $G_y$ is the amplitude of said first magnetic-field gradient;
- $T$ is the temporal interval between the first two zeroes of a sin x/x function used to modulate said 180° RF pulse.

11. The method of claim 8 or 7 wherein said image center is offset from said isocenter by an amount $Y_o$ along the direction of said phase-encoding magnetic-field gradient, such that the amplitude of said inverting RF pulse is caused to have a complex amplitude AM given by $$AM = \frac{\sin(\pi f_B t)}{\pi f_B t} e^{i\omega_1 t},$$

where
- t is time, and
- $f_B$ is the bandwidth of said 180° RF pulse, and wherein $$\omega_1 = 2\pi f_B \frac{Y_o}{L_y},$$

where $L_y$ is the field of view of said portion of said predetermined region.

12. The method of claim 6, 8, or 7 further comprising the step of applying an additional phase-encoding magnetic-field gradient having a direction orthogonal to the phase-encoding gradient in step (c), said additional phase-encoding gradient having one of a plurality of programmable amplitudes; and
  holding the amplitude of one of said phase-encoding gradients constant, while sequencing through all of the programmable amplitudes of the other phase-encoding gradient prior to selecting a different amplitude of said one phase-encoding gradient.

13. The method of claim 12 wherein said image center is offset from said center by an amount $Y_o$ along the direction of said phase-encoding magnetic-field gradient, such that the amplitude of said inverting RF pulse is caused to have a complex amplitude AM given by $$AM = \frac{\sin(\pi f_B t)}{\pi f_B t} e^{i\omega_1 t},$$

where
- t is time, and
- $f_B$ is the bandwidth of said 180° RF pulse, and wherein $$\omega_1 = 2\pi f_B \frac{Y_o}{L_y},$$

where $L_y$ is the field of view of said portion of said predetermined region.

* * * * *